(12) United States Patent
Mitsunaka et al.

(10) Patent No.: US 8,138,255 B2
(45) Date of Patent: Mar. 20, 2012

(54) HEAT-RESISTANT ALUMINUM HYDROXIDE AND METHOD FOR PREPARATION THEREOF

(75) Inventors: Hirofumi Mitsunaka, Ogaki (JP); Kenji Kido, Ogaki (JP); Hirokazu Kihou, Ogaki (JP)

(73) Assignee: Kawai-Lime Ind. Co. Ltd., Gifu (JP)

( * ) Notice: Subject to any disclaimer, the term of this patent is extended or adjusted under 35 U.S.C. 154(b) by 277 days.

(21) Appl. No.: 10/548,780

(22) PCT Filed: Mar. 5, 2004

(86) PCT No.: PCT/JP2004/002886
§ 371 (c)(1),
(2), (4) Date: Sep. 23, 2005

(87) PCT Pub. No.: WO2004/080897
PCT Pub. Date: Sep. 23, 2004

(65) Prior Publication Data
US 2006/0216226 A1    Sep. 28, 2006

(30) Foreign Application Priority Data
Mar. 10, 2003  (JP) .................. 2003-062679

(51) Int. Cl.
C01F 7/02    (2006.01)
C09K 21/02   (2006.01)
C08K 3/10    (2006.01)
(52) U.S. Cl. ......... 524/437; 252/601; 252/609; 423/629
(58) Field of Classification Search .......... 423/625–631; 252/601, 609; 524/437
See application file for complete search history.

(56) References Cited

U.S. PATENT DOCUMENTS

| | | | |
|---|---|---|---|
| 3,931,095 A * | 1/1976 | Kondo et al. | 523/457 |
| 6,403,007 B1 * | 6/2002 | Kido et al. | 264/234 |
| 2006/0189740 A1 * | 8/2006 | Kamimura et al. | 524/430 |

FOREIGN PATENT DOCUMENTS

| | | |
|---|---|---|
| JP | 59-078926 | 5/1984 |
| JP | 02-239113 | 9/1990 |
| JP | 08-291128 | 11/1996 |
| JP | 11-021125 | 1/1999 |
| JP | 2002-002091 | 1/2002 |

(Continued)

OTHER PUBLICATIONS

C.M. Liauw, G.C. Lees, J. Hurst, R.N. Rothon & D.C. Dobson, The effect of filler surface modification on the mechanical properties of aluminium hydroxide filled polypropylene, Plastics, Rubber and Composites Processing and Applications, Aug. 3,1995, p. 1-p. 12, 24, Department of Materials Technology, The Manchester Metropolitan University, Manchester/UK.

(Continued)

*Primary Examiner* — Wayne Langel
(74) *Attorney, Agent, or Firm* — Apex Juris, pllc; Tracy M. Heims

(57) ABSTRACT

A heat-resistant aluminum hydroxide which is prepared by subjecting a mixture of aluminum hydroxide with a reaction retardant for retarding the conversion aluminum hydroxide to boehmite, as a raw material, to the hydrothermal treatment or to pressurization and heating in a steam atmosphere; and a method for preparing a heat-resistant aluminum hydroxide which comprises subjecting a mixture of aluminum hydroxide with a reaction retardant for retarding the conversion aluminum hydroxide to boehmite as a raw material to the hydrothermal treatment, or to pressurization and heating in a steam atmosphere.

10 Claims, 1 Drawing Sheet

FOREIGN PATENT DOCUMENTS

| | | |
|---|---|---|
| JP | 2002-080633 | 3/2002 |
| JP | 2002-338816 | 11/2002 |
| JP | 2003-003171 | 1/2003 |
| JP | 2003-054941 | 2/2003 |
| JP | 2003-507298 A | 2/2003 |
| JP | 2003-002642 | 8/2003 |
| WO | WO02/098795 | * 12/2002 |

OTHER PUBLICATIONS

Masashi Inoue, Yasuhiko Kondo, and Tomoyuki Inui, An Ethylene Glycol Derivative of Boehmite, Inorganic Chemistry, Jan. 27, 1988, p. 215-p. 221, vol. 27, No. 2, American Chemical Society, US.

S. Boryniec and W. Przygocki, Polymer combustion processes. 3. Flame retardants for polymeric materials, International Polymer Science and Technology 1999, p. T/94-p. T/103, vol. 27, 2000.

William E. Horn, Jr., John M. Steinson, & James H. Richardson, A New Line of Surface Treated ATH, Emerging Needs, Product Developments, Non-Halgen FR's, Standards and Regulations, 2000, p. 81-p. 84, US.

Thermo-decomposition charateristics of Higilite H-10, research and testing results from Showa Denko, Ceramic business division, May 8, 2009. Evidence 2 has the newest developments.

* cited by examiner

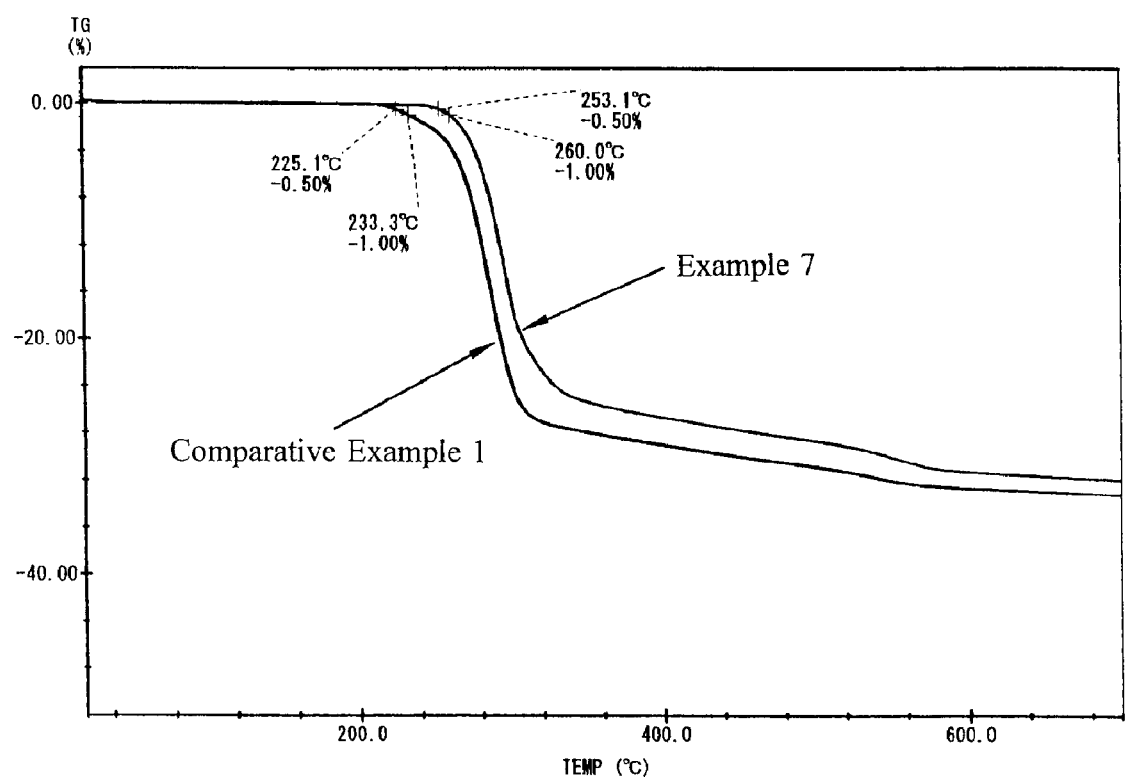

HEAT-RESISTANT ALUMINUM HYDROXIDE AND METHOD FOR PREPARATION THEREOF

FIELD OF THE INVENTION

The present invention relates to a new aluminum hydroxide having a higher dehydration temperature and a sufficiently large amount of dehydration water, in particular to a new aluminum hydroxide favorable as a flame retardant for synthetic resins, and a method of producing the same

BACKGROUND OF THE INVENTION

Synthetic resins have been used widely in various areas, and a flame retardant is generally added to flammable resins for providing flame resistance. In particular, currently when the use amount of a self-extinguishing flame-resistant resin polyvinyl chloride is declining because of its adverse effects on environment, the use amounts of flammable resins such as polyethylene, polypropylene, and polystyrene are increasing as the replacement, which, in turn, is leading to increased demand for flame retardants. In addition, a flame retardant is occasionally added even to flame-resistant synthetic resins for improvement in flame resistance.

Thus, various flame retardants have been provided. The flame retardants used include phosphorus-based retardants (Japanese Patent Application Laid-Open (JP-A) No. 2002-80633), halogen-based retardants (JP-A No. 8-291128), inorganic hydrates such as aluminum hydroxide (JP-A No. 2002-338816), magnesium hydroxide (JP-A No. 2003-3171), and boehmite (JP-A No. 2002-2091); and the like. However, phosphorus-based flame retardants have an environmental problem, for example, of causing aquatic eutrophication, while halogen-based flame retardants of generating smoke and hazardous gases during combustion or incineration, which are attracting attention recently as a possible cause of serious fire deaths, and thus, there exists a need for inorganic flame retardants having no such drawbacks. Among inorganic flame retardants, particularly aluminum hydroxide (Al(OH)$_3$) is rich in constitutional water, superior in flame-retarding effect and in acid and alkali resistances, and also advantageous from the point of cost, and thus are widely used. As for the flame-retarding properties of aluminum hydroxide, dehydration is known to start gradually at approximately 200° C. and progress rapidly at around 230° C. to 250° C.

However, many thermoplastic resins have a molding temperature at around the dehydration temperature of aluminum hydroxide, and dehydration of aluminum hydroxide during molding often resulted in drop in yield because of the bubbles generated in the synthetic resin molded products and the irregularity on the surface thereof. Although thermosetting resins are often molded at a temperature lower than that of thermoplastic resins, these resins are occasionally used at a higher temperature because of the inherent properties of the synthetic resins, for example, as the parts in electric/electronic devices, and aluminum hydroxide therein occasionally resulted in dehydration depending on the environment temperature used, leading to decrease in the yield and deterioration in the physical properties of molded products. For example when a thermosetting resin is used as an electronic board, the environment temperature of the electronic board reaches as high as approximately 230° C. during soldering, leading to dehydration of aluminum hydroxide and consequently to decrease in the yield of the electronic board.

Under the circumstances, it would be possible to use other inorganic flame retardants having a higher dehydration temperature. However, for example, boehmite (AlO(OH)), which has a dehydration peak of around 500° C., may seem advantageous, but has a drawback of containing a smaller amount of constitutional water. Alternatively, magnesium hydroxide (Mg(OH)$_2$), which has a high dehydration peak temperature of about 380° C., is strongly alkaline, facilitating decomposition of the synthetic resin, and unstable to acids, and thus had problems, for example, of prohibiting use thereof in an environment for example in contact with acid and easier solubilization thereof during etching of electronic device parts with acid. Magnesium hydroxide also had a drawback in that it is converted to its basic carbonate salt under high-humidity condition by absorption of the carbon dioxide gas in air, causing a whitening phenomenon of the resin surface containing the flame retardant magnesium hydroxide and affecting the properties of the product.

Accordingly, an aluminum hydroxide flame retardant having a higher dehydration temperature and a sufficiently large amount of dehydration water is most desirable.

SUMMARY OF THE INVENTION

Objects of the present invention is to provide an aluminum hydroxide superior in flame-retarding properties that has a higher dehydration temperature, generates a smaller amount of foam due to dehydration at the environment temperature of molding or using synthetic resins, does not cause drop in the yield of synthetic resin products, and contains a sufficient amount of dehydration water, and a method of producing the same.

The heat-resistant aluminum hydroxide according to the present invention, which achieves the objects above, can be produced by treating a mixture of aluminum hydroxide and a reaction retarder under hydrothermal condition or by applying pressure and heat thereto under a steam atmosphere. The heat-resistant aluminum hydroxide is aluminum hydroxide that retains a sufficient amount of water for dehydration and has a heightened dehydration temperature even after hydrothermal treatment at a temperature in high temperature range or application of pressure and heat under a steam atmosphere because of reduced conversion to boehmite. The hydrothermal treatment means heat treatment of a mixture of aluminum hydroxide and a reaction retarder in a pressure vessel such as autoclave, in the presence of water in an amount sufficient to make the vessel saturated with steam (hereinafter, referred to as wet treatment). Alternatively, the treatment by application of pressure and heat under a steam atmosphere means a pressurization treatment of a mixture of aluminum hydroxide and a reaction retarder in a pressure vessel such as autoclave, in the absence of water or in the presence of water in an amount smaller than that needed for saturating the vessel with steam (hereinafter, referred to as dry treatment). The heat-resistant aluminum hydroxide according to the present invention can be produced by heating the raw materials, aluminum hydroxide and a reaction retarder for retarding boehmite conversion, without addition of water in a pressure vessel heat. The processing by heating raw materials without addition of water in a pressure vessel means a treatment of raw materials under heat without addition of water to the raw materials while generating no steam except the steam from the water dehydrated from some of the aluminum hydroxide as raw material (hereinafter, referred to as dry treatment). Alternatively, the raw materials may be pressurized not only by the pressure by steam but also by supplying compressed air into the pressure vessel from outside.

The reaction retarder is a substance that delays conversion of aluminum hydroxide to boehmite in the wet or dry treatment and provides an aluminum hydroxide that has no or low boehmite conversion rate even after a severe heat history (a high processing temperature and a long processing period allowing conversion of all aluminum hydroxide to boehmite). Generally in wet or dry treatment, almost all aluminum hydroxide is converted to boehmite even after a relatively mild heat history (normally, 160° C./3 hours in dry treatment, 170° C./10 hours in wet treatment (water/aluminum hydroxide: 3 by weight), and 170° C./3 hours in wet treatment (water/aluminum hydroxide: 3 by weight) in the presence of added sodium hydroxide (sodium hydroxide/aluminum hydroxide: 1/12, by molar ratio)). However, by using the reaction retarder according to the present invention, it is possible to reduce the boehmite conversion rate of aluminum hydroxide sufficiently and heighten the dehydration temperature markedly even after a severe heat history, for example, in a wet or dry treatment at 215° C. for 10 hours.

The mechanisms for the rise of the dehydration temperature seem to be (1) reinforcement of the Al—O bonds in aluminum hydroxide crystal by rearrangement caused by the severe heat history, and (2) increase in the surface smoothness of aluminum hydroxide and reduction in the number of dehydration-starting points due to solubilization of a trace amount of aluminum hydroxide by the severe heat history (dehydration seems to be initiated at the surface cracks (defects) on aluminum hydroxide and lead to development in the size of the cracks, which in turn leads to further dehydration in chain reaction).

The processing temperature in the wet or dry treatment is 170° C. or more and 300° C. or less, and preferably 200° C. or more and 250° C. or less. It is because a lower processing temperature prohibits sufficient rise of the dehydration temperature, and although a higher processing temperature is favorable as the heat history is enhanced, an excessively high temperature often raises the boehmite conversion rate, demanding increase in the amount of the reaction retarder added for suppressing the reaction and resulting in drastic increase of the pressure during treatment, making it unpractical to use an autoclave. The processing period in the wet or dry treatment is 1 hour or more and 24 hours or less, and preferably 5 hours or more and 10 hours or less. It is because it is difficult to raise the dehydration temperature sufficiently in a shorter processing period, and although a longer processing period is favorable as the heat history is enhanced, an excessively elongated period often raises the boehmite conversion rate, demanding increase in the amount of the reaction retarder added for suppressing the reaction.

The reaction retarder is not particularly limited, if it is in accord with the above-mentioned definition, and examples thereof include inorganic acids or the salts thereof such as sulfuric acid, nitric acid, phosphoric acid, tetrafluoroboric acid, ammonium dihydrogen phosphate, sodium dihydrogen bisphosphate monohydrate, sodium dihydrogen phosphate, and potassium metaphosphate; organic acids or the salts thereof such as acetic acid, succinic acid, lactic acid, fumaric acid, and tartaric acid; silicon compounds and fluorine compounds such as silica, silane-coupling agent, white carbon, hexafluorosilicic acid, sodium hexafluorosilicate, potassium silicofluoride, aluminium fluoride, flyash, diatomaceous earth, siloxane; and the like. The fluorine compounds broadly include compounds containing one or more fluorine elements; the tetrafluoroboric acid above is an inorganic acid and also a fluorine compound at the same time, and hexafluorosilicic acid, sodium hexafluorosilicate, and potassium silicofluoride are silicon compounds as well as fluorine compounds at the same time. Among these reaction retarders, preferable are silicon compounds and fluorine compounds, and more preferable are noncrystalline silica, white carbon, hexafluorosilicic acid, sodium hexafluorosilicate, potassium silicofluoride, aluminium fluoride, and tetrafluorosilicic acid. The silicon and fluorine compounds have a dehydration temperature higher and exhibit an effect more favorable than those of other acids even under the same processing condition, presumably because these compounds are effective not only in delaying the reaction, but also in accelerating formation of a glassy layer or a coating layer on the aluminum hydroxide surface, raising the dehydration temperature because it is necessary to break the layer for dehydration by heating. The reaction retarders may be used in combination of two or more.

The amount of the reaction retarder added to aluminum hydroxide is preferably 0.05 to 10 parts by weight, more preferably 0.1 to 5 parts by weight, and still more preferably 0.3 to 3 parts by weight, with respect to 100 parts by weight of aluminum hydroxide. It is because it is not possible to suppress boehmite conversion of aluminum hydroxide sufficiently at an amount of less than 0.05 parts by weight, and the reaction retarder may remain as an impurity in aluminum hydroxide and reduce the amount of dehydration water relatively, even if harmless as an impurity, at an amount of more than 10 parts by weight. In the field of flame retardant, phosphorus- and nitrogen-based and other inorganic flame retardants are often mixed with an aluminum hydroxide flame retardant for synergistic effect, and the reaction retarder may be added in an amount beyond the range above, if an additive is added for that purpose.

The present inventors had filed for a patent of a flame-resistant filler of boehmite-aluminum hydroxide composite prepared by hydrothermal treatment of aluminum hydroxide (Japanese Patent Application No. 2002-103146). In the invention, increase in boehmite conversion rate resulted in rise of the dehydration temperature of aluminum hydroxide but drop in the amount of total dehydration water, while decrease in boehmite conversion rate, in drop of the dehydration temperature of aluminum hydroxide and increase in the amount of dehydration water; and in view of the tradeoff, there existed a problem that it was difficult to raise the dehydration temperature and retain a sufficient amount of dehydration water at the same time. However, the heat-resistant aluminum hydroxide according to the present invention makes it possible to heighten the dehydration temperature and retain a sufficient amount of dehydration water by suppressing the boehmite conversion of aluminum hydroxide after a severe heat history, and thus improve both of the contradicting properties, that is, dehydration temperature and amount of dehydration water, at the same time. More specifically, when 1% dehydration temperature is defined as a dehydration temperature at which a flame retardant is dehydrated in an amount of 1%, allowable range in the amount of dehydration water from a flame retardant in synthetic resin, with respect to the total weight of the flame retardant, in contrast to aluminum hydroxide without hydrothermal treatment having a 1% dehydration temperature of about 210 to 230° C., the heat-resistant aluminum hydroxide according to the present invention has a 1% dehydration temperature of 245° C. or more, often 250° C. or more, and still retain a sufficient amount of dehydration water.

Although the heat-resistant aluminum hydroxide according to the present invention include that containing both aluminum hydroxide and boehmite after partial boehmite conversion, it preferably has a total amount of dehydration water of 30% or more, more preferably a boehmite conversion rate of 14% or less and a total amount of dehydration water of 32% or more, and most preferably a total amount of dehydration water of 35% and a boehmite conversion rate of 0%.

In addition, the heat-resistant aluminium according to the present invention preferably has a 1% dehydration temperature of 255° C. or more and a total amount of dehydration water of 30% or more, and in such a case, the average diameter of the raw aluminum hydroxide is preferably 2.5 µm or less.

The heat-resistant aluminum hydroxide according to the present invention, which has a high dehydration temperature and a sufficient amount of dehydration water, can be used as a flame retardant in both thermoplastic and thermosetting resins. The heat-resistant aluminum hydroxide may be used in any synthetic resins, whether flammable or flame resistant, and examples of the resins include various synthetic resins such as methyl methacrylic resins, acryl-styrene copolymer resins, ABS resins, polystyrene, polyethylene, polypropylene, polycarbonate, phenol resins, urea resins, melamine resins, epoxy resins, unsaturated polyester, and diallyl phthalate.

The heat-resistant aluminum hydroxide according to the present invention described above improves the flame-retarding properties of the materials such as synthetic resins markedly when it is added.

BRIEF DESCRIPTION OF THE DRAWINGS

FIG. 1 is a graph showing thermogravimetric curves of the heat-resistant aluminum hydroxides obtained in Example 7 and Comparative Example 1.

BEST MODE OF CARRYING OUT THE INVENTION

Hereinafter, the present invention will be described with reference to Examples, but it should be understood that the present invention is not restricted by the following Examples.

Examples 1 to 19

(Preparation of Heat-Resistant Aluminum Hydroxide 1)

A commercially available aluminum hydroxide (manufactured by Sumitomo Chemical Co., Ltd., hereinafter, C-303) was used in Examples 1 to 11; a commercially available aluminum hydroxide (manufactured by Nippon Light Metal Co., Ltd. hereinafter B703), in Examples 12 and 13; a commercially available aluminum hydroxide (manufactured by Nippon Light Metal Co., Ltd. hereinafter, B1403), in Example 14; a commercially available aluminum hydroxide (manufactured by Nippon Light Metal Co., Ltd. hereinafter, BF013), in Example 15; a commercially available aluminum hydroxide (manufactured by Sumitomo Chemical Co., Ltd., hereinafter, C-3005), in Examples 16 and 17; and a commercially available aluminum hydroxide (manufactured by Showa Denko K.K., hereinafter, H-42M), in Examples 18 and 19, respectively in an amount of 400 g. The reaction retarders used were lactic acid (manufactured by Kanto Chemical Co. Inc.), phosphoric acid (manufactured by Kanto Chemical Co. Inc.), ammonium dihydrogen phosphate (manufactured by Kanto Chemical Co. Inc.), silica (manufactured by Nippon Silica Corp.), a silane-coupling agent (FZ-3794, manufactured by TOSHO Silica Corp.), and white carbon (Carplex CS-5, manufactured by Shionogi & Co., Ltd.), and each reaction retarder was mixed to aluminum hydroxide in an amount shown in the parenthesis of Table 1 with respect to 100 parts by weight of aluminum hydroxide. C-303 is aluminum hydroxide having an average diameter of 2.5 µm prepared by precipitation; B 703, aluminum hydroxide having an average diameter 2.0 µm prepared by pulverization; B1403, aluminum hydroxide having an average diameter of 1 µm prepared by pulverization; BF013, aluminum hydroxide having an average diameter 1.3 µm prepared by precipitation; C-3005, aluminum hydroxide having an average diameter of 0.8 µm prepared by precipitation; and H-42 M, aluminum hydroxide having an average diameter of 1 µm prepared by precipitation. The reaction conditions, processing temperatures and processing periods are summarized in Table 1.

In each Example 3 to 19, the aluminum hydroxide and the reaction retarder shown in Table 1 were blended in a mixer for 30 seconds. The mixture placed in a stainless steel container was treated in an autoclave (electrically heated autoclave equipped with a steam generator, manufactured by Osaka Boiler Mfg. Co., Ltd., capacity: 0.4 m$^3$) at a predetermined temperature for a particular period. After reaction, the resultant reaction product was dried, to give desirable heat-resistant aluminum hydroxide as a colorless powder (dry treatment). Separately, 800 g of aqueous solutions of 1% lactic acid and phosphoric acid were respectively added to and mixed with 400 g of water thoroughly in Examples 1 and 2 (water ratio (water/aluminum hydroxide by weight): 3), and the mixture was subjected to a hydrothermal treatment, to give a heat-resistant aluminum hydroxide as a colorless powder (wet treatment).

Comparative Examples 1 to 10

The aluminum hydroxides of comparative Examples were prepared as follows: C-303 was used in Comparative Examples 1 to 3; B703, in Comparative Example 4; B1403, in Comparative Example 5; BF013, in Comparative Example 6; C-3005, in Comparative Examples 7 to 9; and H-42 M, in Comparative Example 10, respectively in an amount of 400 g. The aluminum hydroxides were untreated in Comparative Examples 1, 4, 5, 6, 9, and 10. The aluminum hydroxides of Comparative Examples 2, 7, 11, and 12 were processed in dry treatment, while those of Comparative Examples 3 and 8, in wet treatment.

In Table 1, the raw aluminum hydroxides were grouped according to the kinds into six test groups: C-303 test group, B 703 test group, B1403 test group, BF013 test group, C-3005 test group, and H-42 M test group.

[Evaluation of the Properties of Heat-Resistant Aluminum Hydroxide]

Boehmite conversion rate, 1% dehydration temperature (° C.), and the total amount of dehydration water (%) of each sample obtained in Examples and Comparative Examples were determined. The boehmite conversion rate is a percentage of boehmite in the total weight of the product obtained by hydrothermal treatment or by applying pressure and heat under steam atmosphere. The boehmite conversion rate was calculated according to the following Formula 1, based on the theoretical total amounts of dehydration water of pure aluminum hydroxide and boehmite: respectively 34.6% and 15%. The 1% dehydration temperature was a temperature at which an entire sample loses its weight by 1% from the weight of the sample at 100° C. when the sample is heated gradually starting from 100° C. The total amount of dehydration water was a weight loss from the weight at 100° C. after heating a sample from 100° C. to 600° C. The percentage of the total amount of dehydration water is a percentage of the weight of the dehydrated water with respect to the weight of aluminum hydroxide. The 1% dehydration temperature and the total amount of dehydration water were determined by thermogravimetric measurement using a thermal analyzer (manufactured by Bruker AXS K.K.). The measurement was conducted in atmosphere at programmed heating rates of 5° C./mim and 10° C./min.

$$34.6X+15Y=Z$$

$$X+Y=1$$

$$X=Z-15/19.6 \quad \text{Formula 1}$$

(wherein, X: ratio of aluminum hydroxide, Y: ratio of boehmite, and Z: measured amount of dehydration water.)

The boehmite conversion rate (%) is calculated by percentage, by determining X by substituting Z with a measured amount of dehydration water and subtracting X from 1.

Results are summarized in the following Table 1. The 1% dehydration temperatures of the aluminum hydroxides of Examples in the C-303 test group were higher by 20 to 38° C. than that of the untreated aluminum hydroxide of Comparative Example 1. In addition, the total amounts of dehydration water of the aluminum hydroxides of the Examples were almost the same as that of the untreated aluminum hydroxide of Comparative Example 1, except in Example 3. The aluminum hydroxide (boehmite) of Comparative Example 2 that was completely converted to boehmite had an extremely low total amount of dehydration water at 15%, although not evaluated because it had a 1% dehydration temperature of around 500° C. The aluminum hydroxide of Comparative Example 3 that was partially converted to boehmite (boehmite conversion rate: 60%) also had a high 1% dehydration temperature similar to those of Examples, but had a total amount of dehydration water of 23%, which was significantly lower than those of the Examples. Namely, as shown in Comparative Example 3, it was necessary to raise the boehmite conversion rate to 50% or more for elevating the 1% dehydration temperature of the aluminum hydroxide prepared only from aluminum hydroxide and partially converted to boehmite to a temperature of 260° C., but it is also accompanied with drastic decrease in the total amount of dehydration water at the same time.

The 1% dehydration temperatures of the aluminum hydroxides of Examples 12 and 13 in the B703 test group were higher by 16° C. than those of the untreated aluminum hydroxide of Comparative Example 4, but on the other hand, there was almost no difference in the total amount of dehydration water (i.e., Example 13 is the same in dehydrated water quantity as Comparative Example 4).

The 1% dehydration temperature of the aluminum hydroxide of Example 14 in the B1403 test group was higher by 23° C. than that of the untreated aluminum hydroxide of Comparative Example 5, and there was no difference in the total amount of dehydration water. The 1% dehydration temperature of the aluminum hydroxide of Example 15 in the BF013 test group was higher by 28° C. than that of the untreated aluminum hydroxide of Comparative Example 6, and there was no difference in the total amount of dehydration water.

The 1% dehydration temperatures of the aluminum hydroxides of Examples 16 and 17 in the C-3005 test group were higher respectively by 34° C. and 37° C. than that of the untreated aluminum hydroxide of Comparative Example 9, and there was no difference in the total amount of dehydration water. Further, the 1% dehydration temperatures of the aluminum hydroxides of Examples 16 and 17 were higher by 12 to 23° C. than those of the aluminum hydroxides of Comparative Examples 7 and 8 (partially boehmite-converted aluminum hydroxide prepared only from aluminum hydroxide), and the total amounts of dehydration water of the aluminum hydroxides of these Examples were also higher.

The 1% dehydration temperature of the aluminum hydroxides of Examples 18 and 19 in the H-42 M test group were higher respectively by 28° C. and 33° C. than that of the untreated aluminum hydroxide of Comparative Example 10, and there was no difference in the total amount of dehydration water between the aluminum hydroxides of Example 19 and Comparative Example 10.

In Examples 8 to 11, 13, and 17, wherein the boehmite conversion rates were 0%, the total amounts of dehydration water were 35%, similarly to those of the untreated aluminum hydroxides of Comparative Examples 1, 4, 5, 6, 9, and 10, but the 1% dehydration temperatures of the aluminum hydroxides of the Examples were significantly higher.

In addition, although the boehmite conversion rate of the aluminum hydroxide of Comparative Example 8 in the G-3005 test group was similar to that of Example 19 in the H-42 M test group, the 1% dehydration temperature of the heat-resistant aluminum hydroxide of Example 19 was markedly higher than that of Comparative Example 8.

TABLE 1

| | Al(OH)$_3$ | Kind and amount of reaction retarder (parts by weight) | Processing Condition Temperature (° C.) | Hour | Boehmite conversion rate (%) | 1% Dehydration temperature (° C.) (1) | (2) | Total amount of dehydration water (%) |
|---|---|---|---|---|---|---|---|---|
| Example 1 | C-303 test | Lactic acid (2) | 215 | 10 | 5 | 263 | 272 | 34 |
| Example 2 | group | Phosphoric acid (2) | 215 | 10 | 11 | 259 | 268 | 32 |
| Example 3 | | Ammonium dihydrogen phosphate (2) | 215 | 10 | 34 | 259 | 269 | 28 |
| Example 4 | | Silica (0.3) | 180 | 10 | 3 | 244 | 252 | 34 |
| Example 5 | | Silica (0.5) | 215 | 5 | 13 | 255 | 265 | 32 |
| Example 6 | | Silica (1) | 215 | 5 | 4 | 254 | 263 | 34 |
| Example 7 | | Silica (1) | 215 | 10 | 8 | 260 | 268 | 33 |
| Example 8 | | Silica (2) | 215 | 5 | 0 | 252 | 260 | 35 |
| Example 9 | | Silica (2) | 215 | 10 | 0 | 258 | 268 | 35 |
| Example 10 | | Silane-coupling agent (1) | 215 | 3 | 0 | 245 | 254 | 35 |
| Example 11 | | Silane-coupling agent (1) | 215 | 10 | 0 | 258 | 266 | 35 |
| Comparative Example 1 | | — | — | — | 0 | 233 | 234 | 35 |
| Comparative Example 2 | | — (Dry treatment) | 170 | 5 | 100 | — | — | 15 |
| Comparative Example 3 | | — (Wet treatment) | 170 | 6 | 60 | 252 | 263 | 23 |
| Example 12 | B703 test | Silica (0.5) | 215 | 3 | 17 | 252 | 259 | 31 |
| Example 13 | group | Silica (2) | 215 | 10 | 0 | 253 | 259 | 35 |

TABLE 1-continued

|  | Al(OH)$_3$ | Kind and amount of reaction retarder (parts by weight) | Processing Condition Temperature (° C.) | Hour | Boehmite conversion rate (%) | 1% Dehydration temperature (° C.) (1) | (2) | Total amount of dehydration water (%) |
|---|---|---|---|---|---|---|---|---|
| Comparative Example 4 |  | — | — | — | 0 | 237 | 243 | 35 |
| Example 14 | B1403 test | Silica (1) | 215 | 3 | 7 | 241 | 249 | 33 |
| Comparative Example 5 | group | — | — | — | 0 | 217 | 226 | 35 |
| Example 15 | BF013 test | Silica (2) | 215 | 10 | 5 | 248 | 255 | 34 |
| Comparative Example 6 | group | — | — | — | 0 | 220 | 227 | 35 |
| Example 16 | C-3005 test | Silica (2) | 215 | 10 | 5 | 252 | 260 | 34 |
| Example 17 | group | Silane-coupling agent (2) | 215 | 10 | 0 | 251 | 257 | 35 |
| Comparative Example 7 |  | — (Dry treatment) | 160 | 1 | 15 | 232 | 237 | 32 |
| Comparative Example 8 |  | — (Wet treatment) | 170 | 6 | 10 | 241 | 245 | 33 |
| Comparative Example 9 |  | — | — | — | 0 | 221 | 223 | 35 |
| Example 18 | H-42M test | Silica (1) | 215 | 10 | 40 | 250 | 257 | 27 |
| Example 19 | group | White carbon (2) | 215 | 10 | 10 | 252 | 262 | 33 |
| Comparative Example 10 |  | — | — | — | 0 | 225 | 229 | 35 |

Examples 1 and 2: wet treatment
Example 3 to Example 19: dry treatment
The 1% dehydration temperatures (1) and (2) were determined respectively under programmed heating rates of 5° C./min and 10° C./min.

As apparent from the results above, the heat-resistant aluminum hydroxides in Examples are new aluminum hydroxides having a controlled boehmite conversion rate and a markedly heightened dehydration temperature and retaining a sufficient amount of dehydration water even after a severe heat history (high processing temperature and long processing period). There was no significant difference due to difference of the raw aluminum hydroxide used among the test groups, and the 1% dehydration temperatures in Examples were significantly higher than those in Comparative Examples in each test group and the heat-resistant aluminum hydroxides in Examples retained a sufficient amount of dehydration water.

Examples 20 to 40

(Preparation of Heat-Resistant Aluminum Hydroxide 2)

Heat-resistant aluminum hydroxides were prepared under a predetermined condition by using the reaction retarders shown in Table 2. C-303 was used as the raw aluminum hydroxide in Examples 20 to 39, and BF083 (manufactured by Nippon Light Metal Co., Ltd. average diameter: 8 μm) in Example 40. The heat-resistant aluminum hydroxides of Examples except those of Examples 25, 26, 36, and 37 were prepared in a similar manner to Examples 3 to 19 above (preparation of heat-resistant aluminium hydroxides 1) (dry treatment). The heat-resistant aluminum hydroxide of Example 25 was prepared by mixing 1 g of white carbon to 50 g of aluminum hydroxide in a mixer and processing the mixture in an autoclave (externally heated autoclave, manufactured by Osaka Boiler Mfg. Co., Ltd., capacity: 100 ml, withstanding pressure: 5 MPa). The heat-resistant aluminum hydroxide of Example 26 was prepared by mixing 10 kg of white carbon to 500 kg of aluminum hydroxide in a mixer and processing the mixture in an autoclave (steam-supplying autoclave, manufactured by Osaka Boiler Mfg. Co., Ltd., capacity: 3.6 m$^3$, withstanding pressure: 3 MPa). The heat-resistant aluminum hydroxide of Example 36 was prepared by placing 2 g (2 parts by weight) of white carbon and 100 g (100 parts by weight) of aluminum hydroxide in an autoclave (externally heated autoclave, manufactured by Osaka Boiler Mfg. Co., Ltd., capacity: 5 L, withstanding pressure: 3 MPa) and heating the mixture at 200° C. for 5 hours without addition of additional water or steam (i.e., under an unsaturated steam condition). The maximum pressure during heating was 250 kPa. The heat-resistant aluminum hydroxide of Example 37 was prepared by placing 12 g (2 parts by weight) of white carbon and 600 g (100 parts by weight) of aluminum hydroxide in an autoclave (externally heated autoclave, manufactured by Osaka Boiler Mfg. Co., Ltd., capacity: 5 L, withstanding pressure: 3 MPa), applying a pressure of 700 kPa from outside with a compressed air at normal temperature (20° C.) and heating the mixture at 200° C. for 12 hours without addition of additional water or steam (i.e., under an unsaturated steam condition). The white carbon used was Nipsil LP (manufactured by Toso Silica Corporation).

Comparative Examples 11 to 13

The aluminum hydroxides (boehmite) of Comparative Examples 11 and 12 were prepared in a similar manner to Examples 3 to 19 above (preparation of heat-resistant aluminium 1) by using C-303 as the raw aluminum hydroxide (dry treatment). In Comparative Example 13, the raw aluminum hydroxide used was BF083.

The boehmite conversion rates, the 1% dehydration temperatures (° C.), and the total amounts of dehydration water (%) of the aluminum hydroxides of the Examples 20 to 38 and Comparative Examples 11 to 13 were determined in a similar manner to (preparation of heat-resistant aluminum hydroxides 1). Results are summarized in Table 2.

TABLE 2

| | Al(OH)₃ | Kind and amount of reaction retarder (parts by weight) | Processing condition Temperature (° C.) | Hour | Boehmite conversion rate (%) | 1% Dehydration temperature (%) (1) | (2) | Total amount of dehydration water (%) |
|---|---|---|---|---|---|---|---|---|
| Comparative Example 11 | C-303 test group | Silica (0.01) (dry treatment) | 180 | 5 | 100 | — | — | 15 |
| Comparative Example 12 | | Silica (0.03) (dry treatment) | 180 | 5 | 100 | — | — | 15 |
| Example 20 | | Silica (0.05) | 180 | 5 | 20 | 248 | 255 | 31 |
| Example 21 | | Sodium hexafluorosilicate (2) | 210 | 12 | 5 | 266 | 273 | 34 |
| Example 22 | | Potassium silicofluoride (2) | 210 | 12 | 7 | 263 | 270 | 33 |
| Example 23 | | Hexafluorosilicic acid (2) | 210 | 12 | 4 | 270 | 279 | 34 |
| Example 24 | | Tetrafluoroboric acid (2) | 210 | 12 | 3 | 269 | 279 | 34 |
| Example 25 | | White carbon (2) | 250 | 12 | 16 | 264 | 273 | 31 |
| Example 26 | | White carbon (2) | 228 | 12 | 9 | — | 272 | 33 |
| Example 27 | | Sodium dihydrogen bisphosphate 1 hydrate (2) | 210 | 12 | 10 | 262 | 271 | 33 |
| Example 28 | | Fumaric acid (2) | 210 | 12 | 6 | 263 | — | 33 |
| Example 29 | | Sodium dihydrogen phosphate (2) | 210 | 12 | 10 | 253 | — | 33 |
| Example 30 | | Tartaric acid (2) | 210 | 12 | 4 | 260 | — | 34 |
| Example 31 | | Diatomaceous earth (2) | 210 | 12 | 6 | 258 | — | 33 |
| Example 32 | | Sodium metaphosphate (2) | 210 | 12 | 13 | 254 | — | 32 |
| Example 33 | | Flyash (2) | 210 | 12 | 10 | 254 | — | 33 |
| Example 34 | | Sodium hexametaphosphate (2) | 210 | 12 | 5 | 253 | — | 34 |
| Example 35 | | Siloxane (1) | 210 | 12 | 5 | 260 | — | 34 |
| Example 36 | | White carbon (2) | 200 | 5 | 3 | — | 273 | 33 |
| Example 37 | | White carbon (2) | 200 | 12 | 8 | — | 271 | 33 |
| Example 38 | | Aluminium fluoride (2) | 210 | 12 | 5 | — | 280 | 34 |
| Example 39 | | Aluminium fluoride (2) + white carbon (2) | 210 | 12 | 0 | — | 280 | 35 |
| Example 40 | BF083 test group | White carbon (2) | 210 | 12 | 23 | 265 | — | 30 |
| Comparative Example 13 | | — | — | — | 8 | 231 | — | 33 |

The 1% dehydration temperatures (1) and (2) were determined respectively under programmed heating rates of 5° C./min and 10° C./min.

As apparent from Table 2, the heat-resistant aluminum hydroxides of Examples 20 to 40 had a high 1% dehydration temperature and a high total amount of dehydration water. The aluminum hydroxides (boehmite) of Comparative Examples 11 and 12 had a total amount of dehydration water of less than half of those of Examples because of complete conversion to boehmite due to the low content of the added reaction retarder silica. Alternatively, the aluminum hydroxide of Comparative Example 13 had a high total amount of dehydration water but a lower dehydration temperature.

Because dehydration in an amount of 0.5% or more is not allowed when the heat-resistant aluminum hydroxide according to the present invention is added to a printed wiring substrate, the 0.5% dehydration temperatures of the aluminum hydroxides of the Examples and the Comparative Examples shown in Tables 1 and 2 were also determined and are summarized in Table 3. The 0.5% dehydration temperature is a dehydration temperature at which the water in aluminum hydroxide was dehydrated in an amount of 0.5% with respect to the total weight.

As apparent from Table 3, the heat-resistant aluminum hydroxides of Examples had a dehydration temperature higher than that of Comparative Examples even at the 0.5% dehydration temperature. The thermogravimetric curves of the aluminum hydroxides of Example 7 and Comparative Example 1 in Table 3 were shown in FIG. 1. As apparent, there are distinct differences both in 0.5% and 1% dehydration temperature between these aluminum hydroxides.

TABLE 3

| | Al(OH)₃ | Kind and amount of reaction retarder (parts by weight) | Processing condition Temperature (° C.) | Hour | Boehmite conversion rate (%) | 1% Dehydration temperature (° C.) 0.5% | 1% | Total amount of dehydration water (%) |
|---|---|---|---|---|---|---|---|---|
| Comparative Example 11 | C-303 test group | — | — | — | 0 | 225 | 233 | 35 |
| Example 7 | | Silica (1) | 215 | 10 | 8 | 253 | 260 | 33 |
| Example 22 | | Sodium silicofluoride (2) | 210 | 12 | 7 | 249 | 263 | 33 |
| Example 23 | | Hexafluorosilicic acid (2) | 210 | 12 | 4 | 260 | 270 | 34 |
| Example 25 | | White carbon (2) | 250 | 12 | 16 | 258 | 264 | 31 |
| Example 30 | | Tartaric acid (2) | 210 | 12 | 4 | 249 | 260 | 34 |
| Example 31 | | Diatomaceous earth (2) | 210 | 12 | 6 | 250 | 258 | 33 |
| Example 32 | | Potassium metaphosphate (2) | 210 | 12 | 13 | 254 | 254 | 32 |
| Example 35 | | Siloxane (1) | 250 | 12 | 5 | 251 | 260 | 34 |
| Example 38 | BF083 test group | White carbon (2) | 210 | 12 | 23 | 258 | 265 | 30 |
| Comparative Example 13 | | — | — | — | 8 | 225 | 231 | 33 |

[Test on Foaming During Polypropylene Molding 1]

The heat-resistant aluminum hydroxide of Example 9 was kneaded as a flame retardant in polypropylene (PP) under the following condition, and presence of foams in the resin extruded from a die was determined by visual observation. Separately, foaming of the PP resin containing a commercially available aluminum hydroxide (untreated) kneaded was evaluated in a similar manner for comparison.

PP used: melt index (MI): 1
Resin kneader: biaxial extruder, manufactured by Ikegai Ltd. PCM45 (diameter: 45 mm),
Cylinder temperature: 200 to 230° C. (set temperature)
Die temperature: 220 to 230° C. (set temperature), 240 to 250° C. (measured value),
Rotational frequency: 100 rpm
Flame retardant added: 100 parts with respect to 100 parts by weight of PP (also in Comparative Example)

The results of the tests above revealed that there was no foaming observed in the flame retardant of Example 9 but there was some foaming in that of Comparative Example.

[Test on Foaming During Polypropylene Molding 2]

Compounds were prepared by supplying each of the aluminum hydroxides prepared in the Examples and Comparative Examples shown in Tables 1 and 2 in an amount of 100 parts by weight with respect to 100 parts by weight of raw polypropylene (PP) from an automatic measuring hopper by using a biaxial extruder (KZW15TW-45MG-NH(−700), manufactured by Technovel Corporation).

The feeding rate of the entire raw materials was 2 kg/hr; the mixture was melt-blended at a predetermined temperature and extruded into a strand (linear resin compound) of 2 mm in diameter; and foaming of the strand was evaluated. Foamed strands had air bubbles inside and surface irregularity, and thus, presence of foams was evaluated by the appearance (without foaming: ○, with foaming: x).

Results are summarized in Table 4.
Basic Extruding Condition
Screw rotational frequency: 350 rpm
Molding Zone Temperature:
(Condition 1) from entrance side: 100-200-200-200-200-200° C.
(Condition 2) from entrance side: 100-200-220-220-220-220° C.
(Condition 3) from entrance side: 100-200-230-230-230-230° C.
Die Temperature;
(Condition 1) 200° C.
(Condition 2) 220° C.
(Condition 3) 230° C.

TABLE 4

| | Foaming test | | |
|---|---|---|---|
| | Condition 1 | Condition 2 | Condition 3 |
| Example 1 | ○ | ○ | |
| Example 2 | ○ | ○ | ○ |
| Example 7 | ○ | ○ | ○ |
| Example 8 | ○ | ○ | ○ |
| Example 9 | ○ | ○ | ○ |
| Comparative Example 1 | ○ | x | x |
| Example 13 | ○ | ○ | ○ |
| Comparative Example 4 | ○ | x | x |
| Example 14 | ○ | ○ | x |
| Comparative Example 5 | x | x | x |

TABLE 4-continued

| | Foaming test | | |
|---|---|---|---|
| | Condition 1 | Condition 2 | Condition 3 |
| Example 15 | ○ | ○ | x |
| Comparative Example 6 | x | x | x |
| Example 16 | ○ | ○ | x |
| Comparative Example 9 | x | x | x |
| Example 18 | ○ | ○ | x |
| Comparative Example 10 | x | x | x |
| Example 21 | ○ | ○ | ○ |
| Example 23 | ○ | ○ | ○ |

As apparent from Table 4, foaming of all aluminum hydroxides of Comparative Examples was observed at a lower temperature, while no foaming of the aluminum hydroxides of Examples was observed even at a higher molding temperature, improving the yield of products even at a relatively higher temperature. In examples, aluminum hydroxides having a greater average particle diameter were superior in heat resistance.

[Test of Foaming of Epoxy Resin Film 1]

Each of the aluminum hydroxides of Example 8 and Comparative Examples 1 and 3 shown in Table 1 was added in an amount of 100 parts by weight to 100 parts by weight of an epoxy resin, and the mixture was cast into a film and cured in a dryer at 200° C. The film thus obtained was placed in a dryer at 280° C., and the period until foaming was determined. As shown in Table 5, the film containing the aluminum hydroxide of Example 8 had a period until foaming markedly longer and a heat resistance higher than those of the films respectively containing the aluminum hydroxide of Comparative Example 1 and 3.

TABLE 5

| | Heat resistance of epoxy resin film at 280° C. |
|---|---|
| Example 8 | 25 min |
| Comparative Example 1 | <1 min |
| Comparative Example 3 | 10 min |

[Test of Foaming of Epoxy Resin Film 2]

Each of the aluminum hydroxides of Example 8 and Comparative Example 1 shown in Table 1 was added in an amount of 100 parts by weight to 100 parts by weight of an epoxy resin, and the mixture was cast into a film and cured in a dryer at 200° C. Foaming of each of the epoxy resin films containing aluminum hydroxide was determined after treatment in a reflow furnace under the following conditions. As shown in Table 6, the film containing the aluminum hydroxide of Example 8 showed no foaming, while that of Comparative Example 1 showed foaming.

Reflow Conditions

Reflow furnace length: 4 m

Traveling speed: 0.8 m/min

Preheater: 150° C.

Reflow temperature: 250° C.

Reflow period: 40 seconds

TABLE 6

| | Heat resistance of epoxy resin film in reflow furnace |
|---|---|
| Example 8 | |
| Comparative Example 1 | x |

INDUSTRIAL APPLICABILITY

The heat-resistant aluminum hydroxide according to the present invention, which has a dehydration temperature higher than that of preexisting aluminum hydroxides and still has a sufficiently great total amount of dehydration water, is extremely useful as a flame retardant, avoids reliably the foaming in synthetic resin molded products due to dehydration of flame retardant at an environment temperature of molding and using the synthetic resins, improves productivity without lowering the yield of synthetic resin molded products, allows cost reduction, and exerts an excellent flame-retarding effect.

By using the properties of the heat-resistant aluminum hydroxide according to the present invention having a dehydration temperature higher than that of preexisting aluminum hydroxides and still having a sufficiently large total amount of dehydration water, it would also be possible to use the aluminum hydroxide in applications other than flame retardants.

In addition, the method of producing the heat-resistant aluminum hydroxide according to the present invention provides the aluminum hydroxide having a higher dehydration temperature and a sufficient large total amount of dehydration water that is extremely useful as a flame retardant. The method of producing the heat-resistant aluminum hydroxide according to the present invention by heating a raw mixture of aluminum hydroxide and a reaction retarder for delaying the boehmite conversion in a pressure vessel without addition of water eliminates the need for drying the heat-resistant aluminum hydroxide, reduces the pressure during production to the saturated steam pressure or less, and thus, allows production thereof in a pressure vessel designed to have a low withstanding pressure and reduction in facility investment and production cost.

What is claimed is:

1. A heat-resistant aluminum hydroxide produced by a hydrothermal treatment of a raw material mixture of aluminum hydroxide and at least a boehmite conversion reaction retarder selected from the group consisting of lactic acid, phosphoric acid, silica, silane-coupling agent, white carbon, sodium dihydrogen bisphosphate 1 hydrate, fumaric acid, sodium dihydrogen phosphate, tartaric acid, diatomaceous earth, sodium metaphosphate, sodium hexametaphosphate, and siloxane under a processing temperature at 170° C. or more and 250° C. or less, and said heat-resistant aluminum hydroxide has a boehmite and where said boehmite is 14% or less of the total weight of the product obtained by said hydrothermal treatment.

2. The heat-resistant aluminum hydroxide according to claim 1, wherein the amount of the reaction retarder added is 0.05 to 10 parts by weight with respect to 100 parts by weight of the aluminum hydroxide.

3. A heat-resistant aluminum hydroxide, wherein said hydroxide has a 1% dehydration temperature of 255° C. or more and a total amount of dehydration water of 30% or more.

4. The heat-resistant aluminum hydroxide according to claim 3, wherein the average diameter of the aluminum hydroxide is 2.5 µm or less.

5. A flame retardant, wherein said retardant includes the heat-resistant aluminum hydroxide according to any one of claims 1, 2, 3 or 4.

6. A synthetic resin composition, wherein said composition contains the flame retardant according to claim 5.

7. The synthetic resin composition according to claim 6, wherein the synthetic resin is polypropylene.

8. The synthetic resin composition according to claim 6, wherein the composition is a printed wiring board.

9. A method of producing a heat-resistant aluminum hydroxide, further comprising processing a raw mixture of aluminum hydroxide and at least a boehmite conversion reaction retarder selected from the group consisting of lactic acid, phosphoric acid, silica, silane-coupling agent, white carbon, sodium dihydrogen bisphosphate 1 hydrate, fumaric acid, sodium dihydrogen phosphate, tartaric acid, diatomaceous earth, sodium metaphosphate, sodium hexametaphosphate, and siloxane by hydrothermal treatment under a processing temperature at 170° C. or more and 250° C. or less and said heat-resistant aluminum hydroxide has a boehmite and where said boehmite is 14% or less of the total weight of the product obtained by said hydrothermal treatment.

10. The method of producing a heat-resistant aluminum hydroxide according to claim 9, wherein the amount of the reaction retarder added is 0.05 to 10 parts by weight with respect to 100 parts by weight of aluminum hydroxide.

* * * * *